United States Patent
Cheriton

(10) Patent No.: US 10,282,122 B2
(45) Date of Patent: May 7, 2019

(54) METHODS AND SYSTEMS OF A MEMORY CONTROLLER FOR HIERARCHICAL IMMUTABLE CONTENT-ADDRESSABLE MEMORY PROCESSOR

(71) Applicant: INTEL CORPORATION, Santa Clara, CA (US)

(72) Inventor: David R. Cheriton, Palo Alto, CA (US)

(73) Assignee: INTEL CORPORATION, Santa Clara, CA (US)

( * ) Notice: Subject to any disclaimer, the term of this patent is extended or adjusted under 35 U.S.C. 154(b) by 171 days.

(21) Appl. No.: 15/335,178

(22) Filed: Oct. 26, 2016

(65) Prior Publication Data

US 2017/0109049 A1     Apr. 20, 2017

Related U.S. Application Data

(63) Continuation of application No. 14/569,007, filed on Dec. 12, 2014, now Pat. No. 9,520,193, which is a
(Continued)

(51) Int. Cl.
*G06F 12/00* (2006.01)
*G06F 3/06* (2006.01)
(Continued)

(52) U.S. Cl.
CPC ............ *G06F 3/064* (2013.01); *G06F 3/0604* (2013.01); *G06F 3/0631* (2013.01);
(Continued)

(58) Field of Classification Search
CPC ............ G06F 11/1435; G06F 2201/84; G06F 12/0246; G06F 2212/7201; G06F 3/064; G06F 12/023
(Continued)

(56) References Cited

U.S. PATENT DOCUMENTS 4,695,949 A   9/1987 Thatte et al.
4,989,137 A   1/1991 Oxley et al.
(Continued)

FOREIGN PATENT DOCUMENTS

CN    1202653 A    12/1998
CN    1462388 A    12/2003
(Continued)

OTHER PUBLICATIONS

Second Chinese Office Action dated May 18, 2016, issued in corresponding Chinese Application No. 201310403763.6.
(Continued)

*Primary Examiner* — Mardochee Chery
(74) *Attorney, Agent, or Firm* — Schwabe, Williamson & Wyatt, P.C.

(57) ABSTRACT

Improved memory management is provided according to a Hierarchical Immutable Content Addressable Memory Processor (HICAMP) architecture. In HICAMP, physical memory is organized as two or more physical memory blocks, each physical memory block having a fixed storage capacity. An indication of which of the physical memory blocks is active at any point in time is provided. A memory controller provides a non-duplicating write capability, where data to be written to the physical memory is compared to contents of all active physical memory blocks at the time of writing, to ensure that no two active memory blocks have the same data after completion of the non-duplicating write.

20 Claims, 4 Drawing Sheets

Related U.S. Application Data continuation of application No. 14/062,301, filed on Oct. 24, 2013, now Pat. No. 8,938,580, which is a continuation of application No. 13/533,125, filed on Jun. 26, 2012, now Pat. No. 8,612,673, which is a continuation of application No. 13/271,137, filed on Oct. 11, 2011, now Pat. No. 8,230,168, which is a continuation of application No. 12/653,889, filed on Dec. 17, 2009, now Pat. No. 8,065,476, which is a continuation of application No. 12/011,311, filed on Jan. 25, 2008, now Pat. No. 7,650,460.

(60) Provisional application No. 60/897,773, filed on Jan. 26, 2007.

(51) Int. Cl.
| | | |
|---|---|---|
| G06F 12/02 | (2006.01) | |
| G06F 12/10 | (2016.01) | |
| G06F 12/109 | (2016.01) | |
| G11C 15/00 | (2006.01) | |
| G11C 15/04 | (2006.01) | |
| G06F 12/0815 | (2016.01) | |

(52) U.S. Cl.
CPC .......... *G06F 3/0673* (2013.01); *G06F 12/023* (2013.01); *G06F 12/0223* (2013.01); *G06F 12/0815* (2013.01); *G06F 12/10* (2013.01); *G06F 12/109* (2013.01); *G11C 15/00* (2013.01); *G11C 15/04* (2013.01); *G06F 12/0261* (2013.01); *G06F 2212/1044* (2013.01); *G06F 2212/621* (2013.01)

(58) Field of Classification Search
USPC ........................................................ 711/108
See application file for complete search history.

(56) References Cited

U.S. PATENT DOCUMENTS

| | | | |
|---|---|---|---|
| 5,247,634 | A | 9/1993 | Cline et al. |
| 5,459,690 | A | 10/1995 | Rieger et al. |
| 5,548,775 | A | 8/1996 | Hershey |
| 5,625,813 | A | 4/1997 | Venn |
| 5,652,864 | A | 7/1997 | Hine |
| 5,685,005 | A | 11/1997 | Garde et al. |
| 5,784,699 | A | 7/1998 | McMahon et al. |
| 5,822,749 | A | 10/1998 | Agarwal |
| 5,864,867 | A | 1/1999 | Krusche et al. |
| 5,950,231 | A | 9/1999 | Nichol |
| 6,349,372 | B1 | 2/2002 | Benveniste et al. |
| 6,449,667 | B1 | 9/2002 | Ganmukhi et al. |
| 6,453,403 | B1 | 9/2002 | Czajkowski |
| 6,643,755 | B2 | 11/2003 | Goodhue et al. |
| 6,754,776 | B2 | 6/2004 | Conway et al. |
| 6,789,156 | B1 | 9/2004 | Waldspurger |
| 6,848,029 | B2 | 1/2005 | Coldewey |
| 6,934,796 | B1 | 8/2005 | Pereira et al. |
| 7,096,322 | B1 | 8/2006 | Sollom et al. |
| 7,245,623 | B1 | 7/2007 | Cheriton |
| 7,254,748 | B1 | 8/2007 | Wright et al. |
| 7,257,693 | B2 | 8/2007 | Newburn et al. |
| 7,269,542 | B2 | 9/2007 | Ruetsch |
| 7,293,155 | B2 | 11/2007 | Mehta et al. |
| 7,650,460 | B2 | 1/2010 | Cheriton |
| 7,773,676 | B2 | 8/2010 | Chung |
| 8,065,476 | B2 | 11/2011 | Cheriton |
| 8,230,168 | B2 | 7/2012 | Cheriton |
| 8,612,673 | B2 | 12/2013 | Cheriton |
| 8,782,373 | B2 | 7/2014 | Karamcheti et al. |
| 8,938,580 | B2 | 1/2015 | Cheriton |
| 2002/0133668 | A1 | 9/2002 | Sherman |
| 2002/0184579 | A1 | 12/2002 | Alvarez et al. |
| 2003/0093616 | A1 | 5/2003 | Slavin |
| 2003/0131348 | A1 | 7/2003 | Hogstrom et al. |
| 2003/0159007 | A1* | 8/2003 | Sawdon .............. G06F 11/1435 711/154 |
| 2003/0236961 | A1 | 12/2003 | Qiu et al. |
| 2004/0107312 | A1 | 6/2004 | Ruetsch |
| 2004/0186840 | A1 | 9/2004 | Dettinger et al. |
| 2005/0065955 | A1 | 3/2005 | Babikov et al. |
| 2005/0090940 | A1 | 4/2005 | Pajakowski et al. |
| 2005/0160234 | A1 | 7/2005 | Newburn et al. |
| 2006/0059314 | A1 | 3/2006 | Bouchard et al. |
| 2006/0155875 | A1 | 7/2006 | Cheriton |
| 2007/0022246 | A1 | 1/2007 | Regev et al. |
| 2007/0055835 | A1* | 3/2007 | Malkin .............. G06F 11/1662 711/162 |
| 2007/0250663 | A1 | 10/2007 | Welsh |
| 2008/0109614 | A1 | 5/2008 | Begon et al. |
| 2009/0112880 | A1 | 4/2009 | Oliveira |
| 2009/0164754 | A1 | 6/2009 | Cheriton |
| 2009/0187726 | A1 | 7/2009 | Serebrin et al. |
| 2009/0198967 | A1 | 8/2009 | Blaner et al. |
| 2009/0319722 | A1 | 12/2009 | Murin et al. |
| 2010/0070698 | A1 | 3/2010 | Ungureanu et al. |
| 2010/0107243 | A1 | 4/2010 | Moyer et al. |
| 2010/0115228 | A1 | 5/2010 | Parker et al. |
| 2011/0010347 | A1 | 1/2011 | Cheriton et al. |
| 2013/0024645 | A1 | 1/2013 | Cheriton |
| 2013/0031331 | A1 | 1/2013 | Cheriton |
| 2015/0194213 | A1 | 7/2015 | Cheriton |

FOREIGN PATENT DOCUMENTS

| | | |
|---|---|---|
| CN | 102197368 A | 9/2011 |
| TW | 308661 | 6/1997 |
| TW | 457424 B | 10/2001 |
| TW | 1228653 B | 3/2005 |
| TW | I260636 B | 8/2006 |
| TW | 200941349 A1 | 10/2009 |

OTHER PUBLICATIONS

Dennis, J.B., Fresh Breeze: A multiprocessor chip architecture guided by modular programming principles, 2003, pp. 7-15, ACM, Sigarch Computer Architecture News, v31.

Walpole, J. et. al., "Maintaining Consistency in Distributed Software Engineering Environments," 1998, pp. 418-425, 8th Inti. Conf. on Distributed Computing Systems.

Chang et al., "Bigtable: A Distributed Storage System for Structured Data," OSDI 2006.

Quinn et al., "Network Based Coherency: Extending a Processor's Coherency Domain over a Standard Network," Hot Chips 20, pp. 1-22, Aug. 2008.

R. Merritt, "Startups give virtualization a novel twist," EE Times, pp. 1-3, Mar. 31, 2008.

R. Merritt, "3Leaflinks 32 AMD chips in one server," EE Times, pp. 1-2, Nov. 3, 2009.

Kota et al., "Large Scale SMP for Opterons," Hot Chips 16, pp. 1-16, Aug. 23 2004.

Kota et al., "Horus: Large-Scale Symmetric Multiprocessing for Opteron Systems," IEEE Micro 25, 2, pp. 30-40, Mar. 2005.

R. Kota, "HORUS: Large Scale SMP using AMD OpteronTM processors", pp. 1-16, Apr. 9, 2005.

C. Monash, XtremeData Inc., "XtremeData announces its DBx data warehouse appliance," pp. 1-15, Jul. 27, 2009.

C. Monash, "Kickfire's FPGA-based technical strategy," pp. 1-12, Aug. 21, 2009.

Mueller et al., "FPGA: what's in it for a database?" In Proceedings of the 35th SIGMOD international Conference on Management of Data, pp. 1-6, Jun. 29-Jul. 2, 2009.

Jack B. Dennis, "A Parallel Program Execution Model Supporting Modular Software Construction," In Proceedings of the Conference on Massively Parallel Programming Models, pp. 1-11, Nov. 12-14, 1997.

Jack B. Dennis, "General parallel computation can be performed with a cycle-free heap," Proceedings of the 1998 International Conference on Parallel Architectures and Compiling Techniques., pp. 96-103, 1998.

(56) References Cited

OTHER PUBLICATIONS

Jack B. Dennis, "Fresh Breeze: a multiprocessor chip architecture guided by modular programming principles," SIGARCH Comput. Archit. News 31, pp. 1-10, Mar. 2003.
Jack B. Dennis, The Fresh Breeze Model of Thread Execution. Workshop on Programming Models for Ubiquitous Parallelism, with PACT-2006, pp. 1-6, Sep. 2006.
Dennis et al., "Collaborative Research: Programming Models and Storage System for High Performance Computation with Many-Core Processors," CAPSL Technical Memo 088, pp. 1-3 & pp. 1-20, May 11, 2009.
Igor Arkadiy Ginzburg, "Optimizing Array Manipulation for the Fresh Breeze Parallel Processor," submitted to the Department of Electrical Engineering and Computer Science, May 18, 2007, pp. 3-80.
Inenaga et al., On-Line Construction of Compact Directed Acyclic Word Graphs, In Discrete Applied Mathematics, 12th Annual Symposium on Combinatorial Pattern Matching, Published Feb. 24, 2004.
Third Chinese Office Action dated Nov. 7, 2016, issued in corresponding Chinese Application No. 201310403763.6, 20 pages.
Notice of Allowance dated Aug. 1, 2016, issued in related U.S. Appl. No. 14/569,007, 18 pages.
Notice of Notice of Allowance dated Nov. 9, 2016, issued in related U.S. Appl. No. 12/842,958, 14 pages.
Office Action dated Jul. 7, 2017, issued in related European Patent Application No. 08 724 801.9, 5 pages.
Supplementary European Search Report dated Nov. 29, 2012, issued in related European Patent Application No. 08 724 801.9, 13 pages.

\* cited by examiner

| VID | PID | count |
|---|---|---|

Fig. 4

| | | |
|---|---|---|
| VID1 | PID1 | 1 |
| VID2 | PID2 | 1 |
| VID3 | PID1 | 1 |

Fig. 5a

| | | |
|---|---|---|
| VID1 | PID3 | 1 |
| VID2 | PID2 | 1 |
| VID3 | PID1 | 1 |

Fig. 5b

| | | |
|---|---|---|
| VID1 | PID3 | 1 |
| VID2 | PID2 | 1 |
| VID3 | PID2 | 1 |

Fig. 5c

| | | |
|---|---|---|
| VID1 | PID3 | 1 |
| VID2 | PID2 | 1 |
| VID3 | PID2 | 2 |
| VID4 | PID4 | 1 |

Fig. 5d

METHODS AND SYSTEMS OF A MEMORY CONTROLLER FOR HIERARCHICAL IMMUTABLE CONTENT-ADDRESSABLE MEMORY PROCESSOR

CROSS REFERENCE TO RELATED APPLICATIONS

This application is a continuation of U.S. patent application Ser. No. 14/569,007, filed on Dec. 12, 2014, entitled "HIERARCHICAL IMMUTABLE CONTENT-ADDRESSABLE MEMORY PROCESSOR," which is a continuation of U.S. patent application Ser. No. 14/062,301, filed Oct. 24, 2013, now U.S. Pat. No. 8,938,580, which is a continuation of U.S. patent application Ser. No. 13/533,125, filed Jun. 26, 2012, now U.S. Pat. No. 8,612,673, which is a continuation of U.S. patent application Ser. No. 13/271,137, filed Oct. 11, 2011, now U.S. Pat. No. 8,230,168, which is a continuation of U.S. patent application Ser. No. 12/653,889, filed Dec. 17, 2009, now U.S. Pat. No. 8,065,476, which is a continuation of Ser. No. 12/011,311, filed Jan. 25, 2008, now U.S. Pat. No. 7,650,460, which claims the benefit of U.S. Provisional Patent Application No. 60/897,773, filed on Jan. 26, 2007, entitled HIERARCHICAL IMMUTABLE CONTENT-ADDRESSABLE MEMORY PROCESSOR," the disclosures of which are hereby incorporated by reference in their entireties,

FIELD OF THE INVENTION

This invention relates to computer memory management.

BACKGROUND

In the conventional Von Neumann computer architecture, memory is structured as a linear array of fixed-size cells, indexed by sequential addresses. FIG. 1 shows an example of this conventional architecture. Execution of instructions 102 results in contents of memory 104 being as shown. Although this approach is simple to implement, and is relatively easy to use for fixed-sized application data units, software structures and techniques are required to handle variable-sized and structured data.

With variable-sized data, software typically implements a dynamic memory allocator that locates a contiguous region of the memory that is at least as large as that requested. However, over the course of extended execution, the memory space can become fragmented into smaller regions so that a memory allocation request fails even though the total amount of memory available is ample. Mechanisms such as generational garbage collectors can re-compact memory periodically by copying regions to make them contiguous but such garbage collection can interfere with the on-going execution of the application when invoked, an aspect not acceptable in real-time systems in particular or ones requiring predictable response in general. Moreover, if a variable-size data item grows in length, software must allocate a new contiguous region of the required size and copy the data to the new location and change all references pointing to the old location to now point to the new location. To facilitate this latter action, some software introduces an extra level of indirection through a fixed size location that provides the actual pointer to the variable-sized data, so there is a single location to update, but at the cost of an extra indirection on each access.

An alternative approach to variable-sized data is to construct the variable-sized data types from non-contiguous memory units using pointers (i.e., use structured data). Structured data is challenging to handle because it is difficult to determine when a memory region can be freed in the presence of the complicated pointer references characteristic of structured data. Access to data in a structured data representation also incurs the overhead of indirecting through pointers to fix the next entry in a variable-size data item.

For applications running in multiple separate processes, structured data introduces further overhead because it is generally necessary to serialize structured data and copy the result to a separate address space and then de-serialize it in order to share the structured data. This arises because the addresses used to structure the data are unique to each address space as a result of the virtual address translation used to provide isolation between processes. Sharing is further impeded by the large granularity of memory pages (e.g., 8 kilobyte or larger) used for address translation in comparison to typical application data units (e.g. 32-128 bytes). As a consequence, applications are either organized as multiple threads within one process, forgoing the protection of separate addresses or else pay a significant penalty in serializing, copying and de-serializing structured data between address spaces.

Recent and anticipated technology developments make the disadvantages of this standard Von Neumann model much more problematic. First of all, memory system performance has not kept pace with increased processor performance, making memory performance an increasingly limiting factor for computer performance. Thus, memory-intensive operations such as copying and garbage collection are becoming proportionally more expensive. Caching has been the primary means to deal with the processor/memory speed mismatch. However, with increasing sizes of memory, larger and more complex application objects and more data-intensive applications, caches are becoming significantly less effective using this conventional memory model.

As a second direction, computer hardware is increasingly relying on parallel execution to achieve performance benefits. In particular, it is feasible to implement multiple "cores" on a single microchip, improving cost-efficiency while allowing sharing of memory controller and cache. However, the extra copying induced by structured data leads to inefficient use of caches because of duplicated data. Moreover, extraneous updates such as reference count updates and false sharing in cache tines with updates leads to further memory and cache inefficiencies.

As a final trend, applications are becoming larger and more complex, enabled by increased memory sizes and processor performance, but increasing the difficulty of maintaining software correctness, especially with demands for on-going improvements and features. At the same time, applications are taking on increasingly time-, mission- and even life-critical functions, making their reliability that much more important.

For these and other reasons, alternative memory architectures have been considered. For example, in U.S. Pat. No. 4,989,137, a user processor accesses memory exclusively by way of a binding register unit which is part of a memory management system. In this manner, the memory management system can hide low level details of physical memory organization from the user processor, and instead presents a logical memory abstraction to the user processor. In U.S. Pat. No. 4,695,949, a block oriented memory is described, where a reference count is maintained for each block, thereby alleviating the need for frequent garbage collection.

In U.S. Pat. No. 5,784,699, a block-oriented memory system having several standard block sizes is considered. Memory allocation requests are rounded up to the nearest standard block size. In U.S. Pat. No. 5,950,231, a block-oriented memory management system controlled with a slack of pointers is considered. In U.S. Pat. No. 5,247,634 and U.S. Pat. No. 5,864,867, memory management based on the use of trees is considered.

However, these preceding approaches, and the standard Von Neumann cache approach, both tend to have difficulties, particularly for structured data. Accordingly, it would be an advance in the art to provide improved memory management, especially for variable-sized and structured data.

SUMMARY

Improved memory management is provided according to a Hierarchical Immutable Content Addressable Memory Processor (HICAMP) architecture. In HICAMP, physical memory is organized as two or more physical memory blocks, each physical memory block having a fixed storage capacity. An indication of which of the physical memory blocks is active at any point in time is provided. A memory controller provides a non-duplicating write capability, where data to be written to the physical memory is compared to contents of all active physical memory blocks at the time of writing, to ensure that no two active memory blocks have the same data after completion of the non-duplicating write. In the case of a duplicate, the existing block is used in place of creating another block with the same value.

BRIEF DESCRIPTION OF THE DRAWINGS

FIG. 4 shows an example of a suitable logical structure for a virtual to physical blockId mapping (VPBIM) for use with an embodiment of the invention.

FIGS. 5a-d show VPBIM examples corresponding to the examples of FIGS. 3a-d.

DETAILED DESCRIPTION

Figure 1:
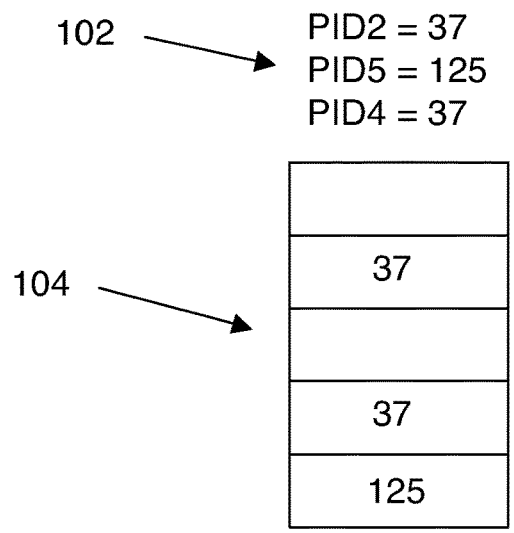
FIG. 1 shows an example of conventional computer memory usage.

In order to better appreciate the present invention, it is helpful to first consider key aspects of embodiments of the invention in a relatively abstract, implementation-independent manner, and then provide some further implementation details by way of illustrative example. Finally, programming techniques for such a system are described.

1) Key Aspects

For brevity, it is convenient to refer to various embodiments of the invention as examples of a Hierarchical Immutable Content-Addressable Memory Processor (HICAMP) architecture. The HICAMP architecture differs front the standard Von Neumann architecture in several fundamental respects.

First, in HICAMP, physical memory's organized as two or more physical memory blocks, each physical memory block having a fixed storage capacity. Second, an indication of which of the physical memory blocks is active at any point in time is provided. Third, a memory controller provides a non-duplicating write capability, where data to be written to the physical memory is compared to contents of all active physical memory blocks at the time of writing, to ensure that no two active memory blocks have the same data after completion of the non-duplicating write.

Several major advantages follow from these aspects of the HICAMP architecture.

1) The conventional issues relating to memory fragmentation are eliminated because allocation of memory is in terms of fixed-sized physical memory blocks. Duplicate suppression allows these blocks to be located and managed efficiently.

2) The amount of memory required for a given amount of application data can be analyzed and bounded relative to the size of the application data because of duplicate suppression.

3) Memory copying is reduced because data can be safely shared, both within an address space and between address spaces because data blocks are not modified while active.

4) Equality/inequality comparison of two objects in memory can be efficiently implemented because they are equal if and only if they are represented by the same physical block.

5) Suppression of duplicates provides more efficient use of available physical memory.

6) Concurrent programming is simplified and made more efficient because non-blocking updates can be performed atomically on many common data structures.

In preferred HICAMP embodiments, the concept of the non-duplicating write is extended to also include data items requiring more that one physical memory block to store (multi-block data, for short). This can be accomplished by providing a multi-block data convention specifying a unique representation for any data item requiring two or more physical blocks to store. The multi-block data convention can then be enforced when multi-block data is written to memory, so that the non-duplicating write ensures that no duplicates of any instance of multi-block data exist in the set of active physical memory blocks.

As one simple example of the effect of a multi-block non-duplicating write, consider the representation of a string "abcde" in a system where physical blocks have a storage capacity of three characters. Such a string can be represented by three blocks in total, where block 1 contains the head of the string, block 2 contains the tail of the string, and block 3 contains pointers to blocks 1 and 2. Without a multi-block uniqueness-providing convention, the example string can be represented as ("abc", "de") or as ("ab", "cde"), where the first item is the contents of block 1 and the second item is the contend of block 2. By enforcing (or supporting) such a multi-block uniqueness convention (e.g., fill the head first, or fill the tail first) the possibility of such multiple representations is removed. As a result, block 3 with its pointers to blocks 1 and 2 is the unique representation of the siring "abcde" in memory, thereby providing for suppression of multi-block duplicates.

Preferably, each of the physical memory blocks has the same storage capacity, to simplify memory management. Also, the physical memory is preferably volatile memory (e.g., computer main memory, such as dynamic RAM), as opposed to persistent memory, such as a file system implemented by recording on magnetic or optical media.

Figure 2:
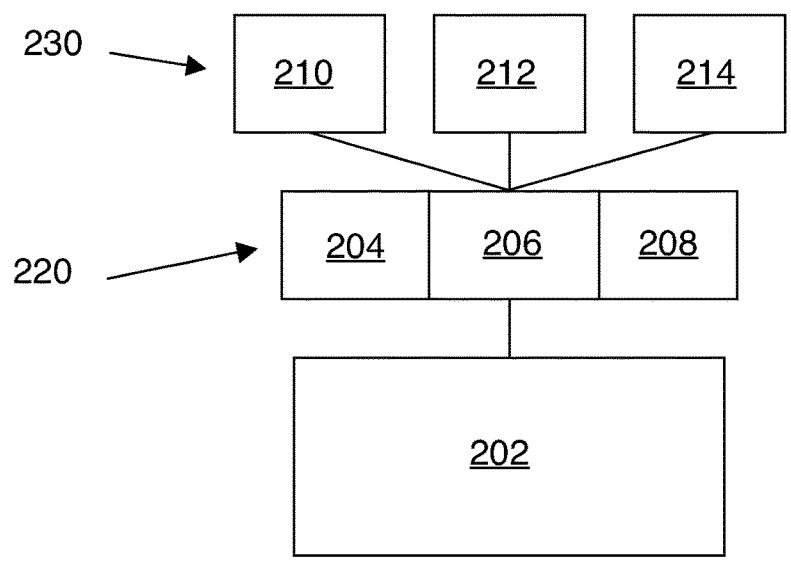
FIG. 2 is a schematic block diagram of a computer system in accordance with an embodiment of the invention.

FIG. 2 shows a preferred embodiment, where HICAMP is implemented by providing a memory controller 220 in communication with physical memory 202. One or more processors 230 can access physical memory 202 by way of memory controller 220, which provides a HICAMP-organized memory model to the processors. In this example, there are three processors, 210, 212, and 214. Thus, HICAMP is applicable to single-processor or multiple-processor contexts. Further details pertaining to memory controller 220 in this example are described below.

Providing an indication of which physical memory blocks are active can be done with a combination of hardware and/or software. In addition, various definitions of "active block" can be employed in practicing the invention. For example, a physical block can be regarded as active if it has been initialized or allocated by the HICAMP system after overall system initialization. With this approach, there is no way to reclaim physical memory blocks that were previously used but presently are not in use. Since some computer systems are designed to be re-initialized as memory runs low, such a relatively minimal indication of "active" may suffice for such systems.

Another approach for providing the "active" indication is to maintain a flag for each memory block indicating whether or not it is active. Such flags could be set according to the previously described initialized/allocated by HICAMP method. Alternatively, the flags for block activity could be set in a separate operation to determine which blocks are active (e.g., as done in mark-and-sweep garbage collection).

A further approach for providing the "active" indication is to maintain a reference count for each physical memory block, where active blocks have a corresponding reference count>0, and inactive blocks have reference count=0. In some cases, such reference counting can distinguish between references having various locations, such as references in processor registers, references in physical memory blocks, and/or references in a virtual to physical blockId mapping (VPBIM).

In a preferred embodiment, a set of tags is provided per block that indicate which fields of a block contain physical and virtual block references versus ordinary data, allowing such block references to be handled as part of reference counting, mark-and-sweep garbage collection or similar "active" determination schemes and to prevent the application level processing from manufacturing block references without the knowledge of the HICAMP embodiment. Other tags can support detecting cyclic references and providing specialized update semantics, such as merge-on-update for high contention data blocks.

In preferred embodiments of HICAMP, a VPBIM is provided to map virtual block IDs to physical block IDs for some or all contents of the physical memory. By providing such a mapping, it is possible to atomically update a representation of structured data while limiting the overhead. For example, a character string description field in an object can be implemented as a memory cell in a block that stores a virtual block ID. This description is updated by creating a revised character string data item with a root physical block and storing the identifier for this physical block in the mapping entry corresponding to the virtual block ID.

FIGS. 3*a-d* show some examples of HICAMP memory usage in connection with virtual and physical block IDs (abbreviated VID and PID on the figures, respectively). This example stores a single value per block for simplicity of exposition. On FIG. 3*a*, execution of instructions 302 leads to the contents of memory 304 being as shown. More specifically, the first assignment in instructions 302 causes the value 37 to be stored in a new physical block (i.e., PID1), and associates VID1 with PID1, because the assignment is to a VID, not to a PID. Similarly, the second assignment in instructions 302 causes the value 125 to be stored in a new physical block (i.e., PID2), and associates VID2 to PID2. The third assignment in instructions 302 only associates VID3 to PID1, since the value for VID3 is a duplicate of a value that has already been stored. This suppression of duplicates is in sharp contrast to the conventional memory model of FIG. 1, where memory access is by way of PIDs, and duplicate values are stored in memory.

Figure 3A:
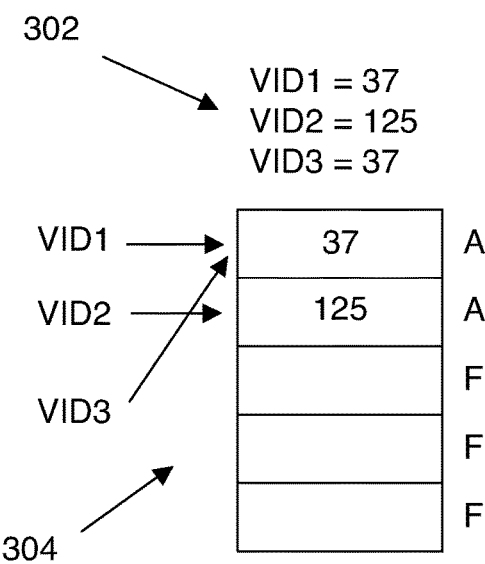
FIGS. 3a-d show examples of computer memory usage in accordance with an embodiment of the invention.
Figure 3B:
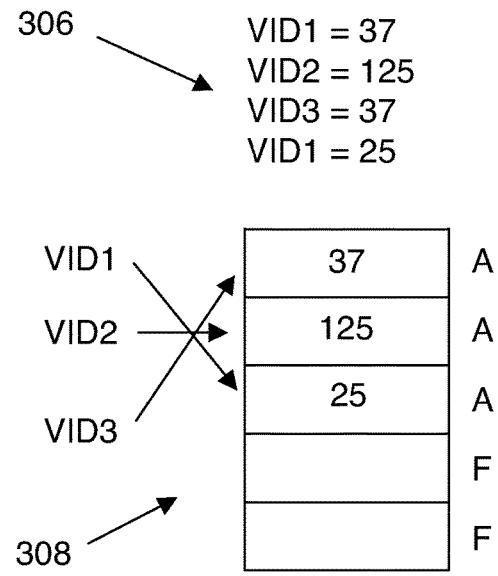

On FIG. 3*b*, execution of instructions 306 leads to the contents of memory 308 being as shown. Instructions 306 differ from instructions 312 only by addition of a final assignment of VID1 to have the value 25. This fourth instruction causes the value 25 to be stored in a new physical block (i.e., PID3), and associates VID1 with PID3.

Figure 3C:
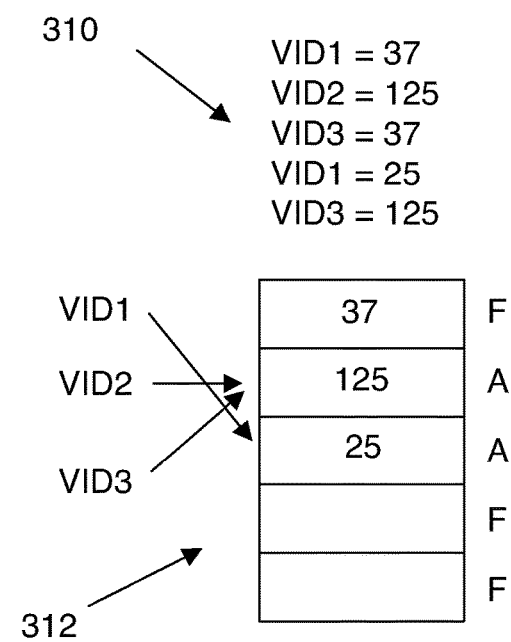

On FIG. 3*c*, execution of instructions 310 leads to the contents of memory 312 being as shown. Instructions 310 differ from instructions 306 only by addition of a final assignment of VID3 to have the value 125. This fifth instruction only associates VID3 with PID2, because the value 125 is already in memory.

Figure 3D:
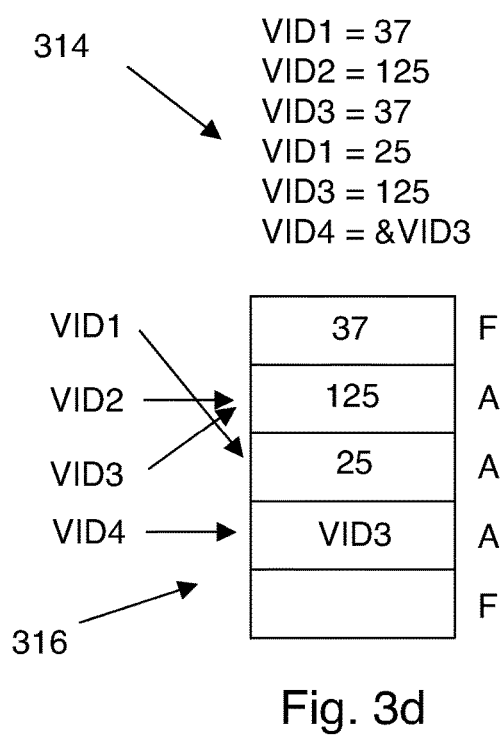

On FIG. 3*d*, execution of instructions 314 leads to the contents of memory 316 being as shown. Instructions 314 differ from instructions 310 only by addition of a final instruction for VID4 to point to VID3. This sixth instruction causes the address VID3 to be stored in a new physical memory block PID4, and associates VID4 to PID4.

This example shows that the ordinary logic of assignment statements and pointers can be provided while eliminating all physical storage of duplicates, by referring to memory contents with VIDs. Once a physical block is created, its contents remain immutable. In the examples of FIGS. 3*a-d*, the letter "A" appears next to physical memory blocks that are active, and the letter "F" appears next to memory blocks that are free (i.e., available for allocation). On FIGS. 3*c-d*, physical block PID1 is marked as free, because there is no reference to it.

FIG. 4 shows an example of a suitable logical structure for implementing a VPBIM. In this example, each entry in the VPBIM include a VID, the corresponding PID, and the number of references to that VID. FIGS. 5*a-d* show VPBIM examples having this structure and corresponding to the examples of FIGS. 3*a-d* respectively. The VPBIM is often a many to one mapping of VIDs to PIDs, since the same PID can correspond to several VIDs, as shown in these examples. Thus the use of VIDs can be regarded as a systematic way to manage multiple distinct references to the same physical data block, which is a situation that inherently arises due to the elimination of physical duplicates in memory characteristic of HICAMP. In an alternate embodiment, the VIDs need not be explicit entries in the VPBIM. Instead, the mapping can be implicit. For example, an array of (PID, reference count) pairs can function as a VPBIM having the array index serve as the VID. The VPBIM can be stored in HICAMP-organized memory in the same manner as any other multi-block data item.

In a preferred embodiment, the HICAMP non-duplicating write capability is provided in terms of a block fetch by content (BFBC) instruction having block data as an input and providing a block identifier as an output. There are two cases to consider. If the input block data is a duplicate of data present in an active physical memory block, then the identifier returned by the BFBC instruction is the address of this existing active memory block.

If the input block data is not a duplicate of data present in any active physical memory block, then a new physical data block is allocated by the memory controller, its contents are set to the input block data, and the block address of this newly active physical memory block is returned by the BFBC instruction.

By structuring memory access in terms of a BFBC instruction, managing the process of duplicate suppression can be performed by the memory controller, and it is not necessary to consider the above two cases separately at the application level. More specifically, an application algorithm expressed in terms of BFBC memory access need not be concerned With the details of memory duplicate suppression, since that is handled by implementation of the BFBC abstraction. The block address returned by a BFBC instruction can be either a physical block ID or a virtual block ID in cases where a VPBIM mapping employed. Typically, it will be more useful for application level BFBC instructions to return a virtual block ID.

In a preferred embodiment, the active physical memory blocks are organized as two or more directed acyclic graphs (DAGs). In such cases, each multi-block data item has its own DAG, a closed loop of references internal to the DAG is ruled out by the condition that it be acyclic, and the directionality of the DAG provides an unambiguous root block to use for referring to the multi-block data item as a whole. To rule out global cyclic reference loops, it is preferred for the set of DAGs to include no multi-DAG cyclic reference loop (e.g., any closed loop of pointer references that includes two or more of the DAGs).

Implementations of HICAMP can rely on various methods for providing content addressability of the physical memory. One approach is to provide a sequential read and compare capability for some or all contents of the physical memory. Another approach is to provide a parallel read and compare capability for some or all contents of the physical memory. For example, a sequential method can be implemented with a single comparator arranged to sequentially read contents of active physical memory blocks and compare them to input data. Similarly, a parallel method can be implemented by providing (e.g., in hardware), separate comparators corresponding to each physical memory block, such that all comparisons of active block contents to input data can be performed simultaneously. Thus, there is a trade-off between speed and cost to consider when determining whether to employ sequential or parallel comparisons (or some hybrid approach) to provide content addressability.

In one preferred embodiment, content addressability for HICAMP is provided by dividing the physical memory into N banks, where N is an integer >1. When data is written to this memory, a hashing function having N possible outputs is applied to the block data to provide a hash value. The hash value is used to select the corresponding bank of memory, which will store the data according to the usual HICAMP conventions (i.e., create a new block in the relevant bank if and only if no duplicate is thereby created in that bank). In this manner, the read and compare capability for content addressing is only required to deal with one bank at a time, as opposed to the entire physical memory. Fast parallel comparisons can be provided by such a scheme if each bank has M blocks and M comparators are provided, which can be substantially less expensive than implementing full block-level parallelism (i.e., NM comparators).

For example, suppose the string "abc" is to be stored to memory according to the above scheme. Assuming that "abc" hashes to 3, then the only place in physical memory where "abc" could be stored in an active physical memory block is in bank 3. Therefore, to prevent duplication, it suffices to check only the blocks in bank 3.

Figure 6A:
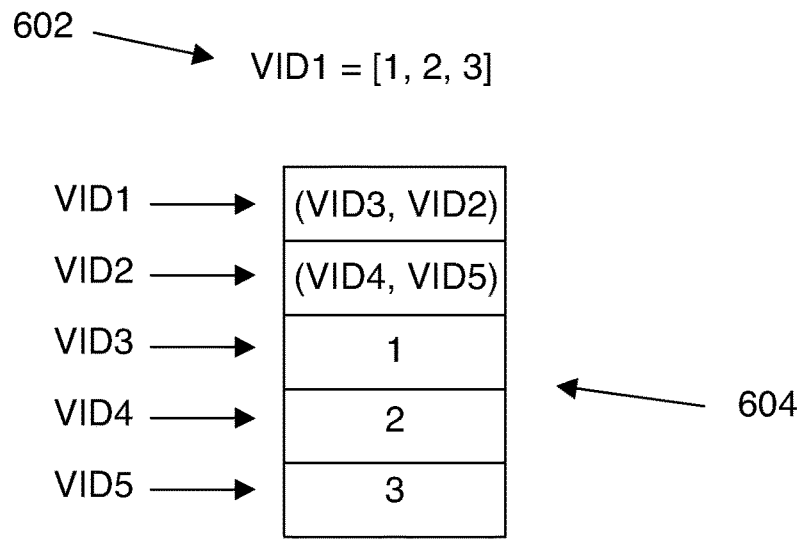
FIGS. 6a-b show an example where the same multi-block object can be represented in memory in two different ways.
Figure 6B:
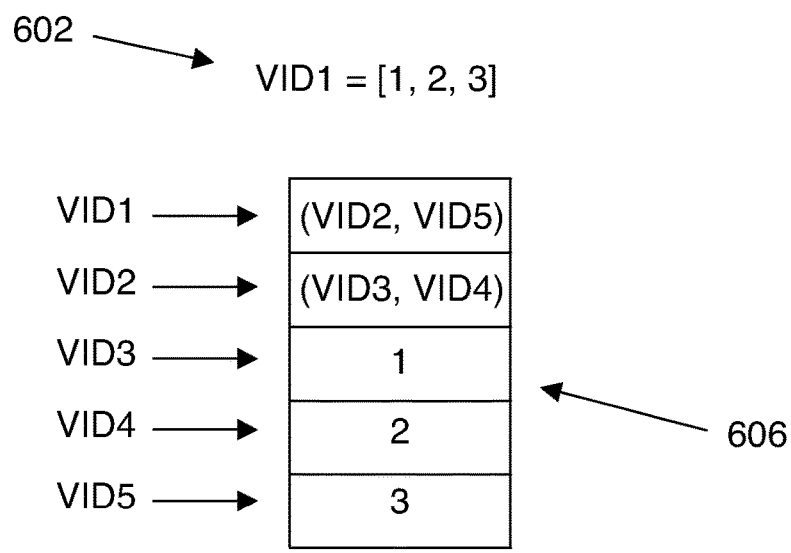

FIGS. 6a-b shows simple examples of a multiple block data object. FIG. 6a shows the result of assigning a three element list [1, 2, 3] to VID1 by instruction 602 in one embodiment of the invention. The resulting contents of memory 604 can be understood as follows. Each list element gets its own physical block, because no elements are duplicated in this example, and virtual IDs VID3, VID4, and VID5 correspond to the array elements. The root of the list is in the block referenced by VID1, and its contents are a pointer (i.e., VID3) to the first element of the list and a pointer (i.e., VID2) to the rest of the list (i.e., to the list [2, 3]). In VID2, there is a pointer (i.e., VID4) to the first element of the list [2, 3], and a pointer (i.e., VID5) to the second element of the list [2, 3].

The example of FIG. 6b is similar to the example of FIG. 6a. The difference between memory contents 606 of FIG. 6b and 604 of FIG. 6a is only in the contents of blocks references by VID1 and VID2. More specifically, the list is built up from its end in the example of FIG. 6a, and from its beginning in the example of FIG. 6b. In order to provide for elimination of multi-block duplicates, it is important for the multi-block uniqueness-providing convention (as described above) to specify a unique organization for all multi-block data structures supported by any given system. With such a convention in place, it will not be possible for the same object to have two different memory representations as on FIGS. 6a-b.

2) Implementation Details

Block Organization

HICAMP physical memory blocks can be structured in one exemplary embodiment as follows:
refCount|tags|inLevel|exLevel|data.

The refCount field contains the number of full references to this block. A back reference as described below is not considered a "full reference". A refCount of zero indicates that the block is free and available to be reused.

The tags field indicates for each subfield of the associated data field:
i) 00—data.
ii) 01—intraRef—contains a blockId referring to a block that is internal and subordinate to this block in a multi-block tree structure. I.e. a subtree reference, accounting for a reference count increment in this block. If any subfield is an intraRef, all the subfields in a block are required to be intraRefs.
iii) 11—extraRef—contains a blockId referring to another block, accounting for a reference count increment in such other block.
iv) 10—backRef—contains a blockId referring to another object, but not representing a reference count increment for this other object.

The extraRef and backRef values are virtual blockIds.
The tags field may include a single "merge-update" flag that indicates the block should be merged on update with the current block contents, rather than replace these contents.

The inLevel field indicates the maximum distance from this node by intraRefs to a node that does not contain intraRefs. For example, in a typical hierarchical (tree or DAG) representation of a variable-sized object, the level is the height of this node in the tree or DAG.

The exLevel field is required to be at least one greater than the exLevel of any node to which it has an extraRef, either directly or indirectly through a node to which it can reach by an intraRef. For example, if this node is the root of a tree representing a multi-block object, the exLevel is greater than the exLevel of all nodes to which this object has an extraRef (equivalent to a smart pointer in conventional programming.) Enforcing this constraint on exLevels is one way to ensure that there are no harmful cyclic reference loops in the HICAMP memory organization.

Analysis

To assess the applicability of HICAMP to various situations, it is helpful to bound the size of the fields added to the memory system and controller, as discussed below.

The number of references to given block is bounded by there being at most a single copy of each content in the system, unlike a conventional memory system. In particular, the worst case is all DAGs having a single common prefix of one block so this one block has the maximal number of references. Each DAG must have an interior node block to reference this common block, plus it must have at least one unique block to ensure each root block is distinct. Moreover, each interior node needs to be referenced by another interior node up to some root node. Then, with 64-byte blocks and a terabyte ($2^{40}$) byte memory (and thus $2^{33}$ blocks), the worst-case number of references is limited to $2^{32}$ such root nodes given it takes 2 blocks to create the minimal additional unique referencing DAG and another one block interior node per minimal DAG to reference these root nodes (I.e. a 32-bit refCount is sufficient). In this structure, the leaves are alternatively sequences of common block and unique block, with the other N uses as interior nodes inside the overall DAG.

Reference cycles are avoided by storing an inLevel and an exLevel per block. The inLevel field needs to be large enough to accommodate the largest intraRef structured object. The number of bits is loglogN/B where N is the largest single object and B is the number of bytes per block. Thus, 6 bits would accommodate objects up to $B*2^{63}$. The exLevel needs to accommodate the depth of extraRefs, which is normally far less than 100. For instance, a directory that points to an object that has subobjects is essentially at exLevel 3. Thus, 8 bits seems more than adequate for this field.

In one embodiment, a block is 20 bytes of data, 4 bytes of refCount, 2 bytes of levels, 1 byte of tags, incurring closer to 25 percent space overhead. The larger block allows 4 blockIds to be stored per block, supporting quad-trees as the hierarchical data representation. Further embodiments can support larger block sizes and multiple block sizes to further reduce the overhead.

Memory Controller

Memory controller 220 of FIG. 2, in one example, includes 3 major components. A blockId/Offset fetcher 204, responsive to a processor request, locates and returns a data block in memory storage corresponding to the specified offset within a hierarchical block structure rooted at the block identified by blockId. A VPBIM 206 translates between virtual block IDs (vBlockIds or VIDs) and physical block IDs (pBlockIds or PIDs) as well as managing the allocation and freeing of these mappings by maintaining a reference count for the PIDs. A block data directory 208 implements a specified data and tag specification to a block (e.g., as described above), allocating and initializing such a block if one does not already exist. Various technologies are known to implement this mapping. In one embodiment, a binary content-addressable memory can be used as the data storage. In this case, the refCount and level can be stored separately in less expensive DRAM. In another embodiment, the mapping can use a choice of lookup data structures such as a tree or a hash table-based implementation described earlier.

In an exemplary embodiment, the memory controller manages DRAM banks of memory organized into blocks of B bytes, where B is expected to be in the range of 16 to 64 bytes, but fixed per system (at least during system operation). It also has an array or 32-bit reference count fields, one per block. One realization is a DRAM array with an entry for each physical block in the system. The memory controller provides operations for atomically incrementing and decrementing the reference count field at a given index, and freeing the block when the reference count is decremented to zero, as described next.

Block allocation can be handled using the reference count field of a free block to link it into a free list of blocks. That is, the reference count field of a free memory block contains the index of the next free memory block in the free list. On system initialization, all free blocks are queued onto this free list. When a new block is required, it is dequeued from the head of the free list by the memory controller and its reference count is reset to 1, corresponding to the new reference. When a reference count of a block goes to zero, the memory controller adds the block to the head of the free list. Correspondingly, bad memory blocks can be removed from the free list so they are not allocated, similar to conventional techniques used at the page level, but with finer granularity. By maintaining a free list tail pointer, freed blocks can be added to the end of the free list so that they are not reused for as long as possible. This optional refinement provides a form of "wear leveling" across blocks when the memory is implemented by a technology such as flash memory where a limited number of writes are supported over the lifetime of the memory chips.

It is feasible to associate an extra bit with the reference count mechanism to indicate its use as a free "next" field in this form to protect against erroneous behavior, such as erroneous reference to a free block.

In this approach, the reference count field needs to be large enough to store blockIds. Alternatively, there can be K free lists such that all the blocks in the i-th free list have i in their low-order bits, eliminating the need for storing them. The utility of partitioning the blocks across K free lists is further described below as part of implementing the content-addressable lookup or Block Fetch By Content (BFBC).

Block fetch by physical block id is performed the same as in a conventional memory. The memory controller decodes the blockId to a DRAM bank, and row/column within this bank, issuing a read of this block and returning the data. The more unusual aspect is supporting Block Fetch By Content (BFBC), as described next.

In the ideal or logical embodiment, the main memory is implemented as a binary Content-Addressable Memory (CAM) of width corresponding to the block size, excluding the reference count field. Thus, the Block Fetch by Content (BFBC) memory controller operation passes the block data to the CAM and receives the block or "row" id back if present and otherwise an absence indication. In the latter case, it allocates a block as above and writes the block with the associated data. The memory can be divided into multiple banks with the lookup performed in parallel in each bank, based on uniqueness of the data across the entire memory system, i.e. there cannot be two hits. This approach may be feasible by building comparison logic into individual DRAM chips. However, binary CAM memory is currently very expensive and power-consumptive relative to conventional DRAM.

An implementation that allows use of conventional DRAM is to reduce the number of comparators so that there is a single comparator for each K rows in a bank, rather than one per row. The block contents are then hashed to values 0 to K−1, say h, and each comparator is requested to compare the data to its h-th associated row. A comparator reports a hit and the block number if the block matches. To make this work correctly, the free blocks are maintained in K free lists. On a miss for data that hashes to h, a block is allocated by the h-th free list to store the data.

Using the above approach, the memory controller can contain C comparators and access the memory in C independent banks, each implemented by conventional DRAM chips. The memory controller then performs the parallel memory fetch and comparison, plus allocation of the block on miss. With suitable hash function, it should be unlikely to exhaust one free list significantly in advance of exhausting all free lists. Conversely stated, the partitioning of the free lists should not appreciably reduce the effective size of memory. The K free lists can be used to reduce the number of bits required to be stored in the reference count field when it is used as the "next" link in the free list, as described earlier.

The size of K and number of comparators can be specific to a particular realization of HICAMP, transparent to the software. It may be dependent on the number of I/O pins feasible on the memory controller. Moreover, in some cases, it may be feasible to issue multiple reads per bank from DRAM per BFBC request, effectively increasing the number of comparators by using them multiple times per BFBC operation.

VPBIM Mechanism

The virtual-to-physical blockId map (VPBIM) can be implemented as memory array indexed by virtual block id (vBlockId). Each entry has the fields:

[BlockId|refCount]

Free entries are chained together using the pBlockId field, similar to the scheme described for pBlocks. With 40 bits for blockId and 32 bits per reference count, each entry is 9 bytes. The memory controller is configured to support enough entries relative to pBlocks so VPBIM entries are not a limiting resource. Assuming a ratio of 1 pointer per 4 words of memory, and 4 words of data per block, the memory controller could provide one VPBIM entry per block, so the pBlockId field is large enough for the free list. Ideally, the memory controller can be configured to support different sizes of VPBIM.

For the VPBIM, the memory controller supports operations to:

a) allocate a VPBIM entry and initialize with a given pBlockId and reference count of 1, incrementing the reference count of the associated pBlockId. This simply involves dequeuing a free VPBIM entry and initializing it.

b) return the pBlockId corresponding to a given vBlockId. This is just indexing the VPBIM array by vBlockId and returning the pBlockId in that entry.

c) increment the reference count for a given vBlockId. This is just indexing the VPBIM array by vBlockId and incrementing the reference count at dial location.

d) decrement the reference count for a given vBlockId and free the entry if the reference count is zero, decrementing the pBlockId and adding this VPBIM entry to the free list.

The above memory controller operations can be implemented using firmware and an internal microcontroller for complex operations, such as allocation. Simple performance-critical operations can use hard-wired logic. The memory controller performance is limited by DRAM performance, as with conventional architecture. Thus, HICAMP processing performance is highly dependent on effectively use of caching at the processor element level, as described next.

Caching

The HICAMP processor element is based on a CPU block implementing conventional register-to-register arithmetic, logical, etc. instructions as well as memory register load operations but augmented further with specialized operations for interfacing with the novel HICAMP memory system. This processor element includes a processor cache to provide efficient access to data that is accessed with temporal and spatial locality, as well-proven with conventional architectures. A key performance challenge for HICAMP is providing fast access to memory, competitive with conventional processor elements. A key aspect for the latter is effective caching.

The HICAMP processor cache is structured as a collection of cache lines that are sized to be compatible with the memory block size, typically matching this block size, the same as a conventional processor cache. Similarly, it includes a conventional cache directory, mapping blockId to cache line, presumably with some reasonable set-associativity, such as 4 or 8. This cache mechanism may be augmented with a HICAMP data-to-blockId mapping, i.e. content addressability. This mapping is implemented similar to the BFBC operation by the memory controller but applied to data in the cache.

In one embodiment, the cache memory is implemented as C memory banks that can each be accessed in parallel. Each bank has R entries, (R stands for "row") each entry corresponding to a cache line and storing the cache line or block data as well as the blockId. Each bank has a comparator that can compare a given block data to that specified entry (i.e. in row r).

The content lookup proceeds as follows:

a) Hash the data block value to an index value r in the range 0 to R−1.

b) Pass the block data to each of the memory banks together with r.

c) Each memory bank looks up its r-th entry and compares it to the block data in parallel.

d) Memory bank with a match returns the blockId associated with the matching entry.

Thus, this mechanism behaves as C parallel hashtables, with collisions on a bank resolved by storing the value in the next memory bank. On miss, a load into the cache selects one of the banks and replaces the r-th entry with the new data, requesting the block from the memory controller, causing it to increment its reference count. An LRU mechanism or similar heuristic selects the bank to use. As one heuristic, there could be R "victim" registers, each treated as identifying a column to use for replacement. I.e. when new data is to be stored in the r-th row, use the index in the r-th victim register to select the column for replacement.

In one embodiment, a block in the cache also constitutes a reference to the memory controller. When a block is deleted from the cache, its reference count is decremented in the memory controller (so replacement has to skip any block that is referenced by a register).

The cache supports operations to retrieve the data block for a given physical blockId, if present. It may also support returning the pBlockId for a given block of data, if present or else relies on the memory controller for this mapping. The cache stores the physical blockId for the block separately from the data subject to comparison. This is a separate bank that is the width of the pBlockId, with R*C entries for C memory banks each having R rows, i.e. one per cache line.

This can be combined with the cache directory supporting lookup on pBlockId as long as the mapping from block to pBlockId is supported.

In the case of a miss, the cache also supports allocation of a block in a transient state referred to as "open", as designated by an extra bit in the cache directory. This allows a block in be incrementally written in the cache and then "committed" to memory when complete, only at that time determining the system pBlockId corresponding to the block data. In particular, a block is committed to memory when its pBlockId is moved front its initial allocation register or when it is stored into memory, or when it is being removed from the cache. The committing entails determining the system-assigned pBlockId for the data and possibly moving the line to the row to which that data hashes. It is possible that committing determines that a block with this data is already present in the cache, causing the original one to be freed, replaced in the segment by the existing block and cache line.

The cache supports "opening" a new or existing cache line for writing. If new, a new line is allocated flagged as open. If existing and the line has additional references, the data is copied to a new cache line and this new cache line is then flagged as open. Committing a cache line closes it to modification, and determines its blockId based on content as above.

The fact that the cache only ever contains at most one copy of data block at any given time improves the cache utilization over conventional processor caches. There are various software techniques, such as aligning data and code on block boundaries and use of standardized instruction sequences that are expected to increase the sharing in the cache.

The above caching approach can also be realized between main memory and secondary storage, such as a disk-based or flash memory storage, where the secondary storage uses the HICAMP structure. In this case, the memory cache reduces the need to access the secondary storage to access data as well as to determine the blockId associated with a specified block contents by using copies of this state stored in a main memory cache along the lines described above.

Memory Operation

The processor accesses data in terms of a vBlockId and offset. For instance, the conventional code segment of a program could be referenced as such so the program counter is an offset in the code segment indicated by a blockId. The hardware traverses the hierarchical structure of the object to locale the data at the specified offset and returns the data, or indicates a memory exception if none. When the data is returned, it is loaded into a processor register that retains the tags indicating whether the data is a blockId or not, and if so, the type of reference it is. Because the hardware lookup proceeds through intraRef blockIds, a blockId in data returned in response to an access is either an extraRef or a backRef, i.e. it is effectively an application-level pointer or reference.

Data fetch can be provided in hardware as an indexed load operation, specifying a blockId and offset, returning the data or blockId at the specified location, or throwing an exception/interrupt. This operation recurses down the tree, returning the data at the specified offset if present and otherwise throws an exception, indicating access failure.

In one embodiment, the processor supports one or more iterator registers that each maintain state required to efficiently map through a multi-block data DAG to a current memory location and to increment efficiently to a next location. Read and write access takes place by indirect reads and writes through an iterator register similar to the use of an address register in a conventional computer processor.

In more detail, each iterator register in the processor element, similar to an indirect addressing register in a conventional architecture, stores a pBlockId array able to designate the path to the current block in the hierarchical representation of a multi-block data DAG, as well as the vBlockId associated with this data unit and an offset, specifying the current location of this register in this segment. It can also contain flags associated with each pBlock, indicating whether it is open or committed.

The iterator register supports increment and decrement, causing it to update the pBlockId array according to its new position. On context switch, it is sufficient to save vBlock and offset, assuming all open pBlocks referenced by the iterator are committed at that time. Each iterator register also supports prefetching referenced pBlocks as it progresses through memory.

The program counter is implemented us an iterator register, supporting efficient access to code segments. (These can be much smaller than a conventional code segment, e.g. an individual module or procedure rather than the entire process code segment). An increment and decrement greater than 1 is used for front and back relative jumps. Fetching instructions indirect through this iterator register is efficient as a conventional program counter because the current blockId and offset (corresponding to an address in the cache) are stored in the iterator state. The presence of the "path" of physical blocks from the root of the segment to the current position means that moving to a new location is also efficient.

In a full implementation of an iterator register, it requires an array of pBlockIds large enough to handle the maximum depth of the largest possible multi-block data DAG. For example, a sparse array indexed by 64-bits could have a depth of 30, requiring an array with this many entries. However, the implementation of iterator registers can be optimized to reduce the space cost by only storing only a small number, L, elements to pBlockId array. Underflow can then arise by popping off the top of array. This is handled by reloading the array from root. There is a time-space trade-off that allows different cost-performance in HICAMP realizations. I.e. Larger L costs space but saves in reloads and vice versa.

The iterator register has a number of advantages in HICAMP:

1) it provides fast data access in the hierarchy representation of a HICAMP segment.

2) it supports intelligent prefetch.

3) it holds transient block state while the segment is open to modification.

In a preferred embodiment, every register of a HICAMP processor element has the state to act as an iterator register. A register indicates by a status flags whether it is acting as an iterator or not. Moreover, for efficiency, the processor can support loading just the root blockId when there is no expectation of accessing indirectly through the register, such as when the value is just to be written elsewhere. In any case, a register is flagged as containing either data or a blockId. Unprivileged instructions do not allow application software to create a blockId-flagged value in a register except by the allocation instructions or by loading an existing blockId value.

In a preferred embodiment, the hardware block fetch by content (BFBC) operation takes a parameter specifying the desired data and tags of a block and returns a virtual blockId for the block. If the BFBC parameter specifies blockIds, it can only be generated from registers that already hold these blockIds. The reference count for a block is also incremented when its blockId is specified in a new block using the BFBC operation.

Reading an existing block containing a blockId and BFBC are the only ways in which the processor can cause a blockId to be present in a register. BlockIds cannot otherwise be generated by computation. Consequently, the hardware system can maintain accurate reference counts on each block and a process can only access objects to which it has received the blockId, either by effectively specifying its contents or by being passed (directly or indirectly) the blockId.

To illustrate basic operation in one embodiment, a HICAMP program creates a string by generating the characters of the string into a block register and then doing a BFBC operation to get a blockId for a block containing those characters, zero-filled at the end. If the string is longer than the number of characters B that can lit into the data portion of a block, the program creates a block for each B characters in the string and effectively concatenates the blocks by using BFBC operations to get block containing blockIds for the prefix and suffix of the string, recursively. Any contiguous data object larger than the data size of a single block can be instantiated in a similar way, e.g. an array.

In one embodiment objects larger than a block can be realized as a binary tree with a root node that contains a blockId for the prefix tree and a blockId for the suffix tree. The blockId 0 may be reserved to mean data is 0. In another embodiment, the tree may be a quad-tree, with up to 4 subnodes per interior node. We refer to a block tree representing a logically contiguous portion of slate as an object, whether a single block or a non-trivial tree.

An object effectively contains a pointer to another object by having an extraRef for the root node of the other object, stored as a virtual blockId, mapped by the VPBIM to the physical blockId. Thus, the object can be changed to point to a different object by atomically updating the VPBIM to map the virtual blockId to the physical blockId of the new object. In one embodiment, compare-and-swap operation supports this atomic update conditional on the current mapping containing a specified physical blockId. Thus, atomic update can be achieved by creating a "virtual" copy of the object to be updated (effectively just another physical blockId reference to the original object), modifying this copy, thereby producing a new object with a new physical blockId. and then atomically updating the VPBIM mapping to map to the new physical blockId if it has not changed since the virtual copy, and otherwise aborting the updating. The software can then retry the operation, following the familiar pattern with lock-free programming.

When a block is created having a new reference to a vBlockId, the reference count on the corresponding vBlockId is incremented. Similarly, when a block containing a vBlockId is freed, the reference count on the corresponding vBlockId is decremented, effectively freeing it and removing its reference to the corresponding physical blockId when the reference count goes to zero. Slated in more familiar terms, the VPBIM maintains the reference counts for the "smart pointer" equivalents in HICAMP, namely the extraRefs.

I/O is required to go through the above mechanism. I.e. there are no direct writes to memory. Each DMA I/O device just requests blocks with given data, building an object such as a packet buffer or a disk block as described as above. This eliminates the need to preallocate I/O buffers. One just needs to bound the amount received, if so desired. In general, the copying associated with networking is largely eliminated, especially if network pay loads start on block boundaries.

3) Software Considerations

To summarize some of the preceding description, we consider a computer system with a specialized memory system Structured as a sequence of memory blocks, each roughly the size of the cache line, say 64 bytes (other sizes are possible) and each identified by a physical block identifier, pBlockId for short. This memory system supports read by specifying the pBlockId of the desired block like a conventional computer. However, it does not support write. Instead, it supports requesting a block with specified contents, returning the pBlockId of a block with the contents, transparently allocating and initializing a block to these contents if no existing block matches these contents. This hardware ensures there is at most one block containing a given contents in the memory system. There is also a system-wide mapping that maps a separate set of virtual block ids, vBlockIds, to pBlockIds. Each block contains tags that indicate which subfields of the block, if any, are pBlockIds or v BlockIds. There is also a means to determine when a block is no longer being referenced, adding it back to the available blocks to allocate in this case.

The processor supports one or more iterator registers that allow efficient access to a hierarchical structure structured as a directed acyclic graph (DAG) where the presence of a pBlockId serves to point to a lower-level block in the tree. Finally, the processor supports operations to open a block in the cache to modification, commit the block (causing it to be mapped to a unique pBlockId in the memory system as above), atomically update an entry of the virtual-to-physical block mapping, access the memory indirect through an iterator register as well as conventional processor instructions.

As an optional extension, the computer supports a per-process map that maps each virtual blockId to two flags, indicating writable and notify. If the writable bit is set for a process for the entry corresponding to a given vBlockId, the process is able to modify the corresponding virtual-to-physical block mapping entry, and otherwise not. If the notify bit is set for a process for the entry for a given vBlockId, the process receives a software interrupt when the entry mapping this vBlockId is changed.

The following description relates to programming such a computer system effectively.
Object Segments Each variable-length logically contiguous data item is implemented as a segment. A segment is a DAG identified and referenced by a virtual blockId that maps to the physical blockId that identifies a top-level block for the segment.

If the object segment in length is less than or equal to the number of bytes that fit into a block, the top-level block is the only block in the segment and this block contains this data, referred to as a data block. (A data block contains no physical blockIds, only data and virtual blockIds).

For a longer segment, the top-level segment contains physical blockIds corresponding to subsegments of the segment, up to a maximum of k which corresponds to the number of physical blockIds that fix in a block. If the object segment is less than or equal to k*B bytes in length, each subsegment is a single data block. Otherwise, subsegments are defined recursively to contain physical blockIds to subsubsegments, and so on. Each subsegment is full for its height (i.e. contains the maximum of data for its height) or is the last subsegment in the object segment. Informally, this means that the object segments are filled from right to left. Consequently, there is a unique representation for an object segment of a given content.

Each conventional data type such as string, array, etc. is stored in an object segment, constructed as above.

Each iterator register contains the vBlockId and offset corresponding to its current location in a segment plus some or all of the pBlockIds that constitute the path through the segment DAG to its current location. It may also contain information on blocks that have been modified in the processor cache but not committed to memory.

Object Segment Operations

Operations on object segments are supported with a small number of base operations. The three key operations are: i) fetch a block by content, as supported by the hardware, ii) creating a reference to segment corresponding to a specified range of an specified segment and iii) insert/replace one segment in another, returning a reference to the corresponding other segment. A special case of the latter is concatenation of one segment to the end of another. For efficiency, we also support appending new data to the end of a segment. These are multi-cycle implementations and thus likely infeasible to support in hard-wired hardware logic.

Appending is extending the end of an existing segment, adjusting the internal structure of the DAG accordingly. Appending is supported by writing indirect through an iterator, relying on the above optimized update mechanism. However, complex processing is required for rebalancing the DAG. This processing can be performed in firmware. In particular, the last block in the segment is opened in advance of the first write with this information stored in the iterator register state being used to access this segment. The appending writes are stored in successive locations in this last block until the end of the block is reached. At this point, a new open block is allocated and subsequent writes are stored in this new block until the end of this block is reached, at which point a new block is opened, and so on. Concurrently, each completed block cache line is committed to memory causing the memory controller to provide a pBlockId for a block containing the data of the designated cache line. Also, a next-level block is written similarly to contain a field containing this pBlockId, and so on to the next level, to match the structural constraints of a segment, as described earlier. The committing of a cache line to memory can be deferred by the iterator register providing extra state associated with these modifications, triggering the committing of a block based on the need to remove it from the cache or the writing of the root pBlockId of the iterator register to another location.

The subsegment operation creates a segment from a starting offset in the source segment to the end offset. This can be performed trivially if the substring corresponds exactly to a subtree. If not, it requires copying the data from the start to end offset through an iterator pointing to the target segment, which is essentially appending to an initially null target segment. This can also be performed in firmware.

Concatenation of two segments creates a target segment that consists of the data of the first source segment followed by the data of the second source segment. In the simple case, the second target segment can be appended to the first simply adding a reference to the second target to the first or else adding a new root node that references both. However, when the source segments are not suitable for this simple handling, concatenation requires appending the second source segment to first.

In the case of insertion/replace, a similar copying occurs except in certain special cases where a single block replacement is possible. For example, if the new segment simply fully replacing another subsegment of the same length in the target segment, the change can be affected by changing the block that points to the original subsegment to point to the new subsegment instead, and then replacing the block that points to this revised block, and so on up to the root of the DAG corresponding to this segment.

Other operations on object segments can be implemented in terms of these operations. For example, an insert/replace of a null segment into an existing segment effectively implements the delete operation at this point of insertion.

The motivation for providing base operations is to minimize the overhead of operations on segments in an application.

Sparse Arrays

Sparse arrays can take advantage of the memory design, in particular the fact that most of the entries of such an array are the default value by the definition of "sparse". For example, a sparse 1-dimension array of floating point numbers would have most entries zero. Similarly, a sparse array of strings would have most entries point to the null string, and thus a common value.

The software instantiates a new sparse array with a specified index size, e.g. 16 bits of index, 32 bits of index, etc. For example, a 32-bit indexed sparse array of 4-byte floating point numbers logically contains 16 gigabytes of data, and would actually require this amount of memory in a non-sparse implementation. In reality, an all-zero array uses 12*64 bytes or less of memory with a 64-byte block based on a common block used as each level of the hierarchy. That is, there is one zero block which we assume exists so is zero cost to this array. Moreover, an (internal) block pointing in all pointer fields to the zero block is shared at the next level. Similarly, for the next level. If there is another sparse array with a similar default value, many of these blocks are also shared with this array so the incremental cost of each additional sparse array is low.

The sparse array mechanism also provides efficiently gains for operators on sparse arrays. In particular, most operations can terminate after detecting they have reached the end of non-default data in the two operands. For example, the entry-wise add of two operands is zero for a zero entry pair so requires the operation only to process to the end of the longest non-zero array, length defined here as the index of the last non-zero entry. This entry is approximately identified by the well-known block Id for the "zero" value of length k.

Sparse values allow numeric computation with large vectors and matrices that are sparse.

Sparse values can also serve as lookup data structures, as used for locating information based on keys. For example, a lookup with a 32 bit key can be implemented with an array indexed by a 32-bit value with the required information located in the corresponding array entry. The usual objection to this approach is either the space cost of the array or else the time cost of lookup in a conventional sparse array data structure.

Here, the space cost is proportional to the number of non-default values. The lookup cost is minimized by the hardware lookup mechanisms. The indexed load of the "address" of the entry corresponding to the key causes the initialization of the iterator register which exploits the cache to locate blocks. It also exploits the iterator register being possibly initialized by the previous access to this array. In effect, the cache acts as a hash map backed by a semi-balanced tree, augmented by the iterator cache of blockIds. In particular, with a fresh iterator load, the lookup through the hierarchy ensures a O(log) lookup cost. This results in some of these blocks being loaded into the cache. A subsequent lookup can be expected to use some of these cached blocks. For instance, it may access a block to locale a different blockId to access a different part of the tree.

This approach can be used for keys that are fixed length and relatively small, such as 64 bits or perhaps even 128 bits.

For longer keys such as strings, each string is represented as a segment so the blockId associated string can be used as the key, which again means the key is 40 bits or so. In particular, each string is mapped to a blockId that is unique for a given siring. (This contrasts with a hash key, which is not necessarily unique.) Given each string is expected to be represented as a segment, there is no extra overhead to get a blockId for the string as part of this lookup.

Thus, efficient lookups are supported for both short fixed-length keys as well as variable-length keys.

Structured Data

By structured data, we refer to data structures that are realized in a conventional architecture by pointers. For example, a queue can be realized as a sequence of data elements with each coupled to the next element by a "next" pointer, with a queue head element that contains a pointer to the first element and a pointer to the last or tail element. Also, an ordered binary search tree is structured as a root node that contains pointers to the left and right subtrees as well as a key value that is greater than key values of the data elements in the left subtree and less than the key values of the data elements in the right subtree. Each subtree root node is structured similarly. There are a multitude of other structured data approaches used with the conventional linear memory architecture to provide variable-size, dynamic extension and contraction, efficient search by key and ordering.

In some cases, a data structure that is so structured in a conventional architecture can be realized as a single object segment in this computer. However, a specialized implementation is required or beneficial for efficiency in many cases. We first consider queues and then map data structures.

Queues

A queue can be realized as an array-like object segment which is incrementally extended as elements are added. If this is an array of pointers to objects in a conventional sense, the array contains vBlockIds, one for each object in the queue; otherwise, each entry stores the value in this queue.

Considering the queue, in a simple realization as an array, dequeuing the first element requires copying the remaining elements forward one entry so that what was the second element is now the first element, what was the third element is now the second, and so on. If the queue is long or the data elements are large, the overhead of the dequeue operation can become excessive because in the expected case, every block in the queue realization needs to be replaced with a different one.

A refinement is to maintain a queue head offset value in a separate queue root segment that also contains a pointer to the array. Then, a dequeue would entail simply incrementing this queue head offset value to indicate the queue head element is now at offset i+1, rather than i. Then, when a dequeue operation causes the elements up to head element to be contained in an initial internal DAG in this representation of this array, these initial elements can be removed by removing this subtree. In this way, dequeue is efficient yet the total space used by the array is bounded.

In practice a queue needs to support deleting an element from the middle of the queue as well. Allowing the array realizing the queue to be an arbitrarily long can cause high cost to a delete a middle element, because the same copying from the deleted element to the end of the queue/array is required. A solution is to provide an array of arrays, where each array corresponds to a portion of the queue bounded by some limit of K elements, what we refer to as a queue segment. Thus, on enqueue, if the current tail segment is K elements, a new queue segment (realized as an array) is created, initialized with this new element, and this queue segment is added to the array of arrays in the queue root element. With this refinement, the delete operation cost is bounded by the bound on the size of the queue segment. The dequeue operation can operate as above, but can instead simply delete a queue segment when empty, removing it from the array of arrays. Note that the array of arrays is actually a queue of queues in the sense that this top-level object segment is a queue ordering the queue segments. Thus, the above techniques, such as using an head offset, can be used on this queue instead of a copying dequeue. Moreover, the limit on K can be applied recursively, so that a queue becomes an N-level array of arrays of arrays, etc. such that each object segment is at most K elements. Finally, recognizing that queues tend to be either very short or long in practice, a short queue can be optimized by representing it as a single object segment, switching to the array of arrays implementation when it exceeds the limit K.

Search Trees

An ordered search tree where the key is a numeric value such as a 32-bit integer and the ordering corresponds to normal ordering on this integer values (or some functional equivalent, such as the inverse) can be realized by a sparse array, implemented as described in an earlier section. If the members of this search tree are objects, each entry in the sparse array is a vBlockId corresponding to the object segment for that member object.

Considering the issue of implementing an ordered tree for other keys, one approach is to use the sparse array for the mapping mechanism, as described above, and then use a separate queue to provide an ordered collection of the elements, allowing iteration over the elements in the structure even though they are not properly ordered in the sparse array. This approach can also be applied when the collection needs to be ordered by insertion, another common application requirement.

As an alternative approach, a conventional B-tree, for example, can be realized by providing a single directly ordered data structure. Here, each node of the B-tree is an object segment, containing pointers to the associated sub-nodes and member objects as well as separate values. Again, the pointers are realized as vBlockIds that are mapped to the pBlockId of the root of the segment corresponding to the associated object.

In general, introducing vBlockIds into a data structure is used to divide it into multiple object segments, allowing the object segments to be kept smaller and thus less expensive to update. However, it also increases the cost of copying the data structure because all the structures containing vBlockIds also need to be copied to maintain copy semantics. In particular, with a single object segment queue, a logical copy is provided by simply providing the pBlockId to this other reference, which is typically an entry in the virtual-to-physical block mapping. (This is because the object segment rooted at this pBlockId is never modified.) However, with a multi-object segment queue, i.e. array of arrays, the top-level array needs to be copied in provide a modifiable copy, replacing each vBlockId in this original top-level segment with a new vBlockId. This ensures that changes to the original queue by way of changing the virtual-to-physical entry for a vBlockId does not change the copy. Additional levels of copy are required in the case of a queue realization with additional levels.

Between processes, a logical copy can be passed without copying and replacing the vBlockIds, relying on the absence of the writable flag in other processes to protect against modification.

As an optimization, a copy of multi-level data structure can replace each vBlockId with the corresponding pBlockId to achieve copy semantics, coalescing this multi-level, multi-object segment structure into a single object segment. This action eliminates the need to allocate new vBlockIds and allows direct iterator access to this single large segment at the cost of (re)introducing the cost of updating a large object segment, as suggested earlier. However, given that a typical use of a copy would not email modifications to the object, this approach is attractive. The C++ programming language, for one, allows tagging a reference to an object as "const" indicating that no modification is intended (or allowed) in general. Thus, a realization could use the "const" designation to indicate when it should use this "reduction to single segment on copy" optimization. For example, the creation of a "const" iterator over a queue would indicate this case, as well as indicating the expected behavior of iterating over all the entries in the queue. The conversion of the queue to a single object segment in this case would further allow the direct use of an iterator register to traverse the queue, providing a further performance benefit over the software iterator implementation required for a multi-level queue structure.

Table Implementation

A conventional database table can be represented as an array of vBlockIds for object segments where each object segment stores the row, i.e. contains the fields of the per-row record. The index into the array is then the recordId. Thus, the i-th record is accessed by looking up the i-th entry of the array to determine the vBlockId for the object segment and then iterating over the fields in that object segment. Thus, the earlier techniques apply directly.

In the simple case, the primary key is an integer value that is equal to the recordId. Then, the array can directly map from key to record. The array may be sparse, as described earlier. In other cases, a separate index data structure can map the key to the recordId which then is used with the array to map to the record. In particular, a string key can be mapped to the recordId using a sparse array as described above. Moreover, if there are no ordering requirements, the pBlockId of the string key can be used as the recordId, eliminating this extra index array.

In some cases, a table is sparse in the sense that many records have null values in many of the columns. In this case, it may be more efficient to store the table column-wise to avoid either representing every field value or having some means of designating the fields that are actually defined, such as tagging each field with a field or column identifier. Thus, in one realization, there is an array per column, indexed by the recordId. Each column array is sparse. Thus, the storage for the table is reduced by the column-wise storage. Moreover, if repeated values occur in the column field, the storage may be further reduced by the duplicate suppression on blocks.

Accessing a record entails determining the associated recordId and accessing the column array for each field of the record which can be expensive with a large number of fields. However, in the common case, a query entails a specified subset of the fields of a record, often a small subset compared to the total number of possible fields in the case of a sparse table. (I.e. the typical query is creating a view that contains a subset of the fields of each record matching the query selection criteria.) Thus, the record access is not significantly more expensive based on an expected common case of accessing a small number of the fields (with one lookup in an array per column/field). Moreover, there is some possibility of greater efficiency based on cache behavior. That is, a query of a large sparse table is only accessing the relevant fields of relevant records (plus sparse array block overhead), a smaller amount to bring into the cache compared to bringing each record as an object segment into the cache.

Merge-Update: Support for High-Contention Concurrent Data

In a highly concurrent execution environment, shared access to certain data structures increases significantly with increasing numbers of concurrent threads or processors, causing conflicts and contention between simultaneous updates. For example, in a standard producer-consumer parallel program, a number of producer parallel threads may be enqueuing in parallel their results onto a common shared queue. As the number of processors increases, the overlap in updates may increase, leading to conflicts and retry of updates using the techniques described so far. In particular, considering the enqueue to a queue implemented as an object segment, one processor may update a copy of the queue with its new element and then atomically change the virtual-to-physical entry to new pBlockId if it still maps to a designated original pBlockId, indicating that no other processor has modified this queue in the meantime. If another processor has modified this queue (as indicated by this virtual-to-physical entry having changed), the processor is forced to abort the operation and redo the enqueue operation from the start, incurring the overhead of redoing. Similarly, a counter that counts the number of some operation or situation needs to be increased by each processor performing this operation or detecting this situation. Again, using the standard approach, a processor would read, increment and commit the block containing the counter, atomically committing this change or else aborting and retrying the counter increment on a conflict.

In some cases, it is feasible to replace the data element per processor and merge the results in some form. For example, in a high-performance switch, the packet counter can be replicated per processor so each processor increments its own copy, and a separate procedure sums across these counters to provide the total count. However, if the counter is based on some aggregate flow that is not restricted on a per-port basis, the counter is necessarily updated by multiple processors. In any case, replicating counters per processor or per thread increases the programming complexity and the cost of determining the total, especially with a varying number of processors and dynamic assignment of processing to threads.

Along similar lines, a queue can be divided into multiple queues so that each processor is enqueuing to its own queue. However, a consumer processor may still need to access any one of these queues to find another element to process, leading to conflicts. Moreover, if there are multiple consumer processes servicing these multiple queues, searching for a new element to process across these queues leads to conflicts between concurrent dequeue operations as well.

To address concurrent data types of this nature, a realization of this architecture supports optionally lagging a block as merge-update. i.e. there is a merge-update bit per block as part of the block lags. When a block is committed that is flagged merge-update, the memory controller determines for each data cell in the block, the difference between the value in each data cell and the value in the original block at the corresponding offset in the segment and then updates the block to commit with the sum of this difference and that of the currently committed block at that offset, with the exception that if the data cell is flagged as a block id and both the committed value and the difference are non-zero, the processor generates an exception and does not commit the update. (That is, it does not allow the addition of two blockIds.) This merge-update mechanism is employed as follows for concurrent data updates.

Overall, the three dominant cases of concurrent data updates are:
a) counters/statistics,
b) shared queues, and
c) shared maps.

Concurrent Counters

Considering the counter implementation first, the block containing the counter is tagged as merge-update. Then, when a processor updates the counter, its update is merged by addition with the current value rather than overwriting. For example, suppose the cell corresponds to a counter with value 4 at the start of the update, and the current processor adds 2 to this counter concurrently with another processor adding 3 to this counter. Thus, at the point that this processor commits the change, the difference to the original is 2, so the block that it commits is 4+3+2=9, which represents the cumulative effect of the two processors. If a segment contains only merge-update data cells, a processor can perform the update without checking for a conflict when updating the virtual-to-physical because all the conflicts are resolved. Thus, a segment of statistics counters with multiple counters can be updated concurrently with no risk of retry even when multiple processors are updating the statistics concurrently.

Concurrent Queues

A concurrent queue can be implemented by recognizing that the true head and tail locations can be indicated by an index value that each can be updated as a counter. These index values are stored in a merge-update block. Also, every block of the queue data is tagged as merge-update and the entries of the queue segment beyond the tail are initialized to zero. An enqueue operation first atomically increments the tail offset, effectively atomically allocating that tail position for its insertion. It then updates the block location at this tail offset with the value to store in the queue. Because this queue data is also merge-updated, even if two or more processors are concurrently adding to the queue, because of the atomic update to the tail offset, they are writing different locations in the queue so merge-update achieves the desired correct result. Moreover, because an enqueue is writing a blockId to a previous zero entry, the difference mechanism provides the desired end value without an exception.

This mechanism requires each value written in the queue is fixed size. We assume that variable-size elements are handled by storing a pointer (i.e. vBlockId) value in the queue to reference the actual member segment.

A dequeue operation is implemented similarly. It first atomically increments the head offset, effectively allocating that element to the current processor. It then reads the entry at that location. (It may clear the location to use the normal mechanism to dereference the vBlockId stored at that location, assuming a queue of pointers. As an optimization, a realization could provide a means to dereference the vBlockId without changing this entry to save on updates, i.e. not otherwise modify the entry.)

There are two other issues to consider. First, how to deal with a concurrent dequeue while enqueues are taking place. In particular, the head of the queue may be the tail element that some processor has advanced the tail index passed but has yet to set. To handle this case, we require that the consuming processor be able to detect a null entry and retry the read of this entry repeatedly until it is set. For example, a queue of pointers would have a null value in this unwritten entry until it is written. To handle processor failure, a consuming processor may have invoke some recovery procedure if the entry is not set after some amount of waiting.

A related issue is dealing with hitting a sue limit condition on enqueue when the queue is implemented as an array of arrays. An enqueue operation may have to modify this structure. One solution here is to give the processor that allocates the first entry beyond the end of the current queue structure ownership to update the overall queue structure to provide more entries. Then, any other processor that allocates an index beyond the current queue end waits for this otter processor to extend the queue. This ensures a unique selection of processor to extend the queue.

Concurrent Map

In the case of a concurrent map, the requirement is that of supporting concurrent update of a map data structure, a structure allowing objects to be looked up by key. These elements are added and deleted concurrently by parallel threads. Here, we are focused on the case of this map containing pointers to objects.

In this architecture, using merge-update, this data structure is implemented as a sparse array with the leaf data blocks flagged as merge-update and empty entries set to 0. When a leaf block is committed, it is possible that another processor has concurrently updated and committed this block with another pointer value as part of adding a new entry or removing an entry. If this is a different entry than that updated by the current processor, merge-update proceeds to produce the merge of the other update with this current update because the difference for each field is either zero or the current value or the other value is zero. For example, the other processor may have written entry i to a new blockId from zero while the current processor wrote entry j from zero to a new blockId. If the two processors added a blockId to the same location, the updates are in conflict and result in a non-zero difference being added to a blockId, causing a processor exception, signaling the current processor to redo the operation.

Using this mechanism, updates to this map sparse array that do not conflict can be performed concurrently without abort retry yet the processor is signaled on conflict on a specific entry. This conflict is a logical conflict at the application level because two threads are simultaneously trying to add two different entries with the same key. Thus, it requires application intervention, but also is expected to be a rare occurrence.

It is feasible to use merge-update to implement other data structures to handle high contention as well.

Tokenized Input

In some programs, the input is parsed into tokens, many of which are known in advance, such as keywords in an input language. That is, the division of input into tokens is known according to some act of rules on input processing.

In this case, as the input is processed, it is divided into tokens and looked up based on these tokens. The creation of a token as an object segment effectively maps this token to a unique blockId. This key can then be used in a second lookup to efficiently map to information on this token using the sparse array implementation as above.

Substring Search

In some applications, significant processing is involved with finding a substring in a larger search string. If substring is at least one block in size, one first computes blockIds for first block, [1,b] bytes, [2,b+2] blocks until b+i is end of the substring. Then, one can search at the block level comparing each of the above blockIds to those in the search string. This is expected to speed the search because one is comparing blockIds rather the long sequence of match bytes. If the search string is short, the matching is close to linear in any case. It is not clear how to improve on this.

Application Use of Reference Counts

In an embodiment of HICAMP that uses reference counts per VPBIM entry, the application can pre-initialize blocks with a specified list of words from a dictionary, with each word stored in a separate segment, referenced by a vBlockId from the dictionary array. Then, the application can read an input source of text, parsing it into words and storing the vBlockId for each into an array of words. Then, the application can read the reference counts of the VPBIM entries for words in the dictionary to determine the frequency of words in this input source. The reference counts then indicate the number of references to words, subtracting out the reference count to each word as it stood just before the input operation, typically one from the dictionary.

The application can also build the dictionary as part of processing the input by adding it to the dictionary if not previous defined. The dictionary is then structured as a sparse array indexed by the pBlockId of the word, allowing one to efficiently check for existence by that means.

In the case of an input data set that is larger than can fit in memory at one time, the processing can proceed in multiple stages. In particular, the application reads in a first "window" of data, saves the resulting counts, deletes the array of words and then repeals the process with the next window until done (where "window" is some subset of the data set that docs fit in memory). It can use a separate sparse array of integers for the counts, indexed by the vBlockId in the dictionary of the word. Thus, the count can be incremented on the subsequent window, recognizing that the count for a word not seen previously is by default 0.

An application may also store an array per sentence that references the words in the sentence, and then have an array of sentences, that is, an array where each entry is a vBlockId for a sentence. In this case, it can lookup the word in the dictionary to determine its vBlockId and build each sentence as an array segment of the corresponding vBlockIds of the words in the sentence so two identical sentences would be represented as identical arrays. Then, the application can determine if the same sentence occurs more than once by examining the reference count for the VPBIM entry for each sentence vBlockId. This can be perforated as a post-processing step or at the point that a sentence is constructed. In the latter case, additional information can be stored or processing performed, such as the location of the duplicate, for example.

If the input dataset is structured into larger units such as pages, an application can maintain an array of sentences per page to represent page itself. It also maintains a map of sentence arrays, indexed by sentence pBlockId. Then, each page array is constructed as a sequence of the unique vBlockIds of the individual sentences. Thus, the reference count per page array VPBIM entry indicates the number of duplicate pages in the input data set.

The application can use the unique pBlockId generated in this structure per word, per sentence and per page as a logical recordId, indexing a table stored column-wise to record additional information about this object, as described earlier for table implementations. Partitioning the table by column allows a separate parallel thread per field to perform the processing to determine its field of the record within minimal processing conflict.

In a conventional architecture, the application would have to explicitly perform a lookup and increment a count on each data unit, word, sentence and page, with significant attendant processing overhead. For example, to check for duplicate pages using a hash table of pages, it would require computing the hash on each input page, checking in the hash table for an existing page with these contents and in the process, checking the entire page byte by byte against any pages that hashed to the same bucket. In an architecture with reference counting but no duplication suppression or uniqueness to the representation, a reference count does not have particular semantic meaning because it may be just one of several reference counts for the same data value and dial data value may be stored in multiple separately reference-counted locations.

Besides these advantages, the above structure would mean that the HICAMP mechanisms of duplicate suppression would reduce the amount of memory required for the input data set as part of its processing. For example, if the input data set was a large collection of web pages, each word occurring in the input data set would be stored only once, and otherwise just be referenced multiple times by the above arrays. Duplicate sentences and pages and even fragments thereof in some cases would further reduce the space. Nonetheless, the application would still be able to perform other processing per web page in this HICAMP representation including reconstructing the original web page contents.

In general, the HICAMP mechanisms for unique data value identification and reference counting of these values can be used in a variety of ways by applications beyond those described here.

Other Software Optimizations

It seems feasible to optimize the generated code for this memory system. In particular, it seems feasible to maximize the number of common code blocks (which are shared) by starting procedures on block boundaries and moving immediate data to registers in common patterns. There may be other options.

Legacy Software

If this architecture is realized with a conventional instruction set, it is able to execute legacy software in an address space, treating the code segment as an single array or segment and the data segment as another array (or both as a single large array if no split I-D space). In this selling, there is a default "array" for the code and data segments, and an indexed address load just loads the offset using a default object.

It may be feasible to evolve/optimize legacy software to selectively use more object segments structured as above. For example, an application that has a lookup structure that is performance-critical could be changed to use a sparse array implementation described above, leaving most of the software unchanged. This modification is facilitated if the access to this data structure is controlled through a well-specified interface and the data type for the key is instantiated as an object segment.

CONCLUDING REMARKS

In summary, it is feasible to program a computer with a specialized memory system as described above so that:

a) there is no external fragmentation of memory from variable-sized objects;
b) every variable-length datum has a unique representation, eliminating redundant data in memory and thereby increasing the efficiency of physical memory utilization;
c) the unique representation also means that two segments can be compared for equality based only on their root physical blockId:
d) a logical copy of a datum can by provided by simple creating a new reference to the physical blockId that is the root of the segment containing this datum, i.e. a single register assignment, independent of the length of the datum. This copy mechanism can be used to create a copy of an object, logically update the copy and then perform an atomic update to replace the old segment by the new segment;
e) a subsegment of an object can be atomically updated by creating a modified subsegment (with a corresponding different pBlockId) and atomically replacing the old subsegment with the new subsegment by changing the vBlockId mapping to map to his new pBlockId; and
f) updates to high-contention counters, queues and maps are handled without locking or abort/redo using the merge-update option on blocks.

The present invention has now been described in accordance with several exemplary embodiments, which are intended to be illustrative in all aspects, rather than restrictive. Thus, the present invention is capable of many variations in detailed implementation either in hardware and/or software, which may be derived from the description contained herein by a person of ordinary skill in the art. One variation relates to the embodiment where HICAMP is realized as multiple processors operating through a single logical memory controller, as shown in FIG. 2. The invention can also be realized With multiple memory controllers and processor chips by suitable synchronization between the different units on allocation of blocks and updates to the VPBIM. In another variation, although described for a general-purpose computer, this invention is also applicable to network packet switches, allowing cell/block allocations with duplicate suppression, providing sharing of content without special optimizations for multicast. It is also applicable to other devices with memory systems. For example, this invention is also applicable to file servers where the non-duplicative blocks are provided in a secondary storage device such as a disk or flash memory. In yet another variation, mechanisms ascribed to hardware can instead be implemented in microcode or protected software or even unprotected mechanisms at some loss in reliability. All such variations and other variations are considered to be within the scope and spirit of the present invention.

The invention claimed is:

1. A memory controller comprising:
a fetcher to:
receive a data element to be written to a physical memory having a plurality of physical memory blocks, wherein each physical memory block is associated with an indication of whether it is active, and is further structured to include a reference count field indicating a number of references to the physical memory block, and a data field; and
determine whether the data element is already contained in an active physical memory block of the physical memory; and
a block data directory to allocate a physical memory block of the physical memory using the reference count field of the physical memory block, responsive to a determination by the fetcher that the data element is not already contained in any active physical memory block of the physical memory.

2. The memory controller of claim 1, wherein the fetcher is to receive the data element with a block fetch by content (BFBC) instruction.

3. The memory controller of claim 2, wherein the fetcher is to return a block address corresponding to the active physical memory block that already contains the data element responsive to reception of the BFBC instruction and responsive to a determination by the fetcher that the data element is already contained in the active physical memory block.

4. The memory controller of claim 3, wherein the block address is a virtual block identifier (ID).

5. The memory controller of claim 3, wherein the block address is a physical block identifier (ID).

6. The memory controller of claim 2, wherein the fetcher is to return a block address corresponding to the block allocated by the block data directory responsive to reception of the BFBC instruction and responsive to a determination by the fetcher that the data element is not already contained in any of the active physical memory blocks.

7. The memory controller of claim 1, further comprising a virtual to physical block ID mapping (VPBIM) to map virtual block identifiers (IDs) to physical block IDs for one or more contents of the physical memory.

8. The memory controller of claim 1, wherein the physical memory is a binary content-addressable memory (CAM) and each physical memory block has a fixed storage capacity.

9. A method of computer memory management at a memory controller comprising:
receiving a data element to be written to a physical memory having a plurality of physical memory blocks, wherein each physical memory block is associated with an indication of whether it is active, and is further structured to include a reference count field indicating a number of references to the physical memory block, and a data field;
determining whether the data element is contained in any active physical memory block as an existing data element; and
using the existing data element in response to a determination that one of the active physical memory blocks already contains the data element as the existing data element.

10. The method of claim 9, further comprising:
returning a block address corresponding to the active physical memory block that contains the existing data element in response to receiving the data element.

11. The method of claim 10, wherein the block address is a virtual block identifier (ID).

12. The method of claim 10, wherein the block address is a physical block identifier (ID).

13. The method of claim 9, wherein the data element is a first data element, the existing data element is a first existing data element, and the method further comprises:
receiving a second data element to be written to the physical memory;
determining whether the second data element is contained in any active physical memory block as a second existing data element; and
allocating a physical memory block using the reference count field of the physical memory block, in response to determining that the second data element is not contained in any of the active physical memory blocks as a second existing data element.

14. The method of claim 13, further comprising:
returning a physical block identifier (ID) of the allocated physical memory block in response to receiving the second data element.

15. A computer system comprising:
a memory comprising a plurality of physical memory blocks, wherein each physical memory block is associated with an indication of whether it is active, and is further structured to include a reference count field indicating a number of references to the physical memory block, and a data field; and
a memory controller coupled with the memory to:
receive a data element to be written to the memory;
determine whether the data element is already contained in any active physical memory block of the memory as an existing data element;
use the existing data element in response to a determination that the data element is already contained in one of the active physical memory blocks as the existing data element; and
allocate a physical memory block of the plurality of physical memory blocks using the reference count field of the physical memory block, in response to a determination that the data element is not already contained in any active physical memory block of the plurality of physical memory blocks.

16. The computer system of claim 15, wherein the memory is a content-addressable physical memory.

17. The computer system of claim 15, wherein the memory is conventional dynamic random access memory (DRAM).

18. The computer system of claim 15, further comprising a processor coupled with the memory controller, wherein the memory controller is to receive the data element from the processor.

19. The computer system of claim 18, wherein the data element is included in a block fetch by content (BFBC) instruction.

20. The computer system of claim 18, wherein the memory is a content-addressable physical memory and the processor includes a content-addressable cache.

* * * * *